United States Patent [19]

Satomura

[11] Patent Number: 4,860,324
[45] Date of Patent: Aug. 22, 1989

[54] INFORMATION DATA RECOVERING APPARATUS

[75] Inventor: Seiichiro Satomura, Kawasaki, Japan

[73] Assignee: Canon Kabushiki Kaisha, Tokyo, Japan

[21] Appl. No.: 67,958

[22] Filed: Jun. 30, 1987

[30] Foreign Application Priority Data

Jul. 3, 1986 [JP] Japan .................. 61-157013

[51] Int. Cl.⁴ ............................................. H04B 1/66
[52] U.S. Cl. ...................................... 375/122; 371/47; 341/59
[58] Field of Search ................. 375/114, 116, 122, 25, 375/111, 112; 358/261; 371/42, 46, 47; 340/347 DD; 360/40, 39; 341/59

[56] References Cited

U.S. PATENT DOCUMENTS

| | | | |
|---|---|---|---|
| 3,689,899 | 9/1972 | Franaszek | 371/47 |
| 3,883,847 | 5/1975 | Frank . | |
| 4,207,599 | 6/1980 | Murayama et al. | 358/261 |
| 4,691,193 | 9/1987 | Khu | 340/347 DD |

FOREIGN PATENT DOCUMENTS

| | | |
|---|---|---|
| 0081767 | 6/1983 | European Pat. Off. . |
| 3137704 | 4/1982 | Fed. Rep. of Germany . |
| 1573753 | 8/1980 | United Kingdom . |

OTHER PUBLICATIONS

United Kingdom Search Report of Apr. 9, 1986.
Official Letter from German Patent Office dated Dec. 15, 1986 with Translation.

Primary Examiner—Benedict V. Safourek
Assistant Examiner—Marianne Huseman
Attorney, Agent, or Firm—Fitzpatrick, Cella, Harper and Scinto

[57] ABSTRACT

An information data recovering apparatus which recovers the original information data from transmitted data of (2, 7, 1, 2, 3) Run Length Limited code to which the original data is converted. When 7 successive "0"-bits of a train of transmitted data are input to the apparatus, bit data at a position spaced by a predetermined number of bits from that time is converted as the head of original data and the input transmitted data subsequent to the bit data is converted to the original data.

11 Claims, 4 Drawing Sheets

| INFORMATION DATA | CODING DATA |
|---|---|
| MSB　　　　LSB | MSB　　　　　　LSB |
| 0 0 0 | 0 0 0 1 0 0 |
| 1 0 | 0 1 0 0 |
| 0 1 0 | 1 0 0 1 0 0 |
| 0 0 1 0 | 0 0 1 0 0 1 0 0 |
| 1 1 | 1 0 0 0 |
| 0 1 1 | 0 0 1 0 0 0 |
| 0 0 1 1 | 0 0 0 0 1 0 0 0 |

Fig. 5

| INFORMATION DATA | CODING DATA |
|---|---|
| MSB       LSB | MSB       LSB |
| 1 | X 0 |
| 0 1 | 0 0 0 1 |
| 0 0 1 | 0 0 0 0 1 0 |
| 0 0 0 1 | 0 0 1 0 0 1 |

NOTE X: WHEN "0" SUCCEEDS MORE THAN TWO TIMES IN THE PREVIOUS DATA, THEN X = 1.

WHEN "0" SUCCEEDS LESS THAN TWO TIMES IN THE PREVIOUS DATA, THEN X = 0.

INFORMATION DATA RECOVERING APPARATUS

BACKGROUND OF THE INVENTION

1. Field of the Invention

This invention relates to a data information recovering apparatus which recovers the original information data from transmitted data of a (2, 7, 1, 2, 3) Run Length Limited code to which the information data is converted.

2. Related Background Art

Conventionally, when information data in binary form is to be transmitted, it is required to be converted to a train of codes suitable for the transmission channel.

For example, when information data is to be magnetically recorded, the recordable band of data is limited by losses due to the gap in the magnetic head, the space between the magnetic head and the magnetic recording medium, the thickness of the magnetic recording medium, etc. Magnetic recording of information data is performed by magnetic inversion, so that it is very difficult to record information data which contains DC and low frequency components. Especially, when a signal of low frequency components and having only a few magnetic inversions is recorded, the recording system has no well-known self-clocking function so that low reliability results.

From a standpoint of cost, it is desirable to convert the information data to a train of codes suitable for high density recording and record it. In this train of codes, little intersymbol interference or peak shift will occur. However, this train of codes is likely to be influenced by jitter, etc.

A conversion system suitable for magnetic recording and satisfying the above various conditions to some extent and described above may include a well-known (2, 7, 1, 2, 3) Run Length Limited coding technique, which is used in a magnetic disc recording apparatus or the like.

The (2, 7, 1, 2, 3) Run Length Limited coding includes conversion of information data in accordance with a correspondence such as is shown in FIG. 2 or FIG. 5 in which the resulting train of codes contains between adjacent "1s" two to seven successive "0s", and the number of magnetic inversions of whatever train of information data is few during recording, so that it is possible to increase the number of data bits for the density of magnetic inversions.

If a coding system of this type is represented by (a, b, c, d, e) Run Length Limited coding, a represents the smallest number of successive "0"-bits after coding, b represents the largest number of successive "0"-bits after coding, c represents the number of bits before coding, d represents the number of bits after coding and corresponds to c, and e represents the kind of the bit length after coding. Therefore, the (2, 7, 1, 2, 3) Run Length Limited coding expresses that the number of successive "0"-bits after coding is 2 at its minimum and 7 at its maximum, that 2-bit coded data is output for 1-bit input data, and that the kind of bit length after coding is 3. It is to be noted that the (2, 7, 1, 2, 3) Run Length Limited coding technique is disclosed in U.S. Pat. No. 3,689,899 and further description thereof will be omitted.

The resulting information data converted by this (2, 7, 1, 2, 3) Run length Limited coding is recorded together with an index signal for every predetermined quantity of data. When the information data is to be recovered, the index signals are detected and the data following each index signal is reversely converted in accordance with a correspondence table shown in FIG. 2 or in FIG. 5 to recover the information data.

If it is impossible to detect an index signal when the information data is to be recovered, or if a shift occurs among the reproduction data elements between the index signals due to jitter, etc., it will be impossible to recover the correct original data. It is possible to avoid this problem by inserting many index signals during recording, but the density of recorded information data would be lowered.

SUMMARY OF THE INVENTION

It is an object of this invention to eliminate the above discussed problems.

It is another object of this invention to recover correct original information data from information data subjected to (2, 7, 1, 2, 3) Run Length Limited coding.

According to this invention, there is provided as one embodiment an information data recovering apparatus which recovers the original data from transmitted data of (2, 7, 1, 2, 3) Run Length Limited code to which the original data is converted, comprising:

means for receiving the transmitted data and detecting the data pattern of a train of n (n is an integer) of 7 or more) data bits of the input transmitted data;

determination means for outputting a determination signal when a train of data bits having a data pattern including 7 successive data "0"-bits is detected by the detecting means; and means for converting the input transmitted data to the original information data when the determination means outputs the determination signal with the data bit at the position spaced by a predetermined number of bits from the bit position at that time being converted as the head or border of the original information data.

It is still another object of this invention to use a simple structure to recover the original information data correctly from information data subjected to Run Length Limited coding without degrading transmission density of information data.

Also, according to this invention, there is provided as one embodiment an information data recovering apparatus which recovers the original information data from transmitted data of the (2, 7, 1, 2, 3) Run Length Limited code to which the original data is converted, comprising:

detection means for receiving the transmitted data, detecting data of 7 successive "0"-bits and outputting a detection signal when the data of 7 successive "0"-bits is detected;

data conversion means for converting the transmitted data to information data in one-to-one correspondence to the data train pattern of the transmitted data; and control means for controlling the data conversion means so that the data conversion means converts data with the bit data, input a predetermined bit interval after the detection signal is output from the detection means, being converted as the head of the data train pattern.

Other objects and features of this invention will be apparent from the following detailed description of specific embodiments thereof when read in conjunction with accompanying drawings.

BRIEF DESCRIPTION OF THE DRAWINGS

FIG. 5 illustrates a correspondence between the original information data and information data subjected to another Run Length Limited coding.

DETAILED DESCRIPTION OF THE PREFERRED EMBODIMENTS

Now, this invention will be described with reference to an embodiment thereof.

Figures 1, 2:
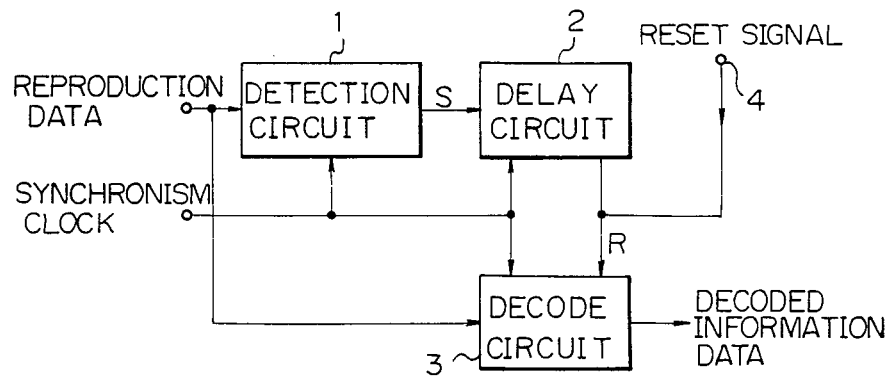
FIG. 1 is a schematic of a decoding apparatus as one embodiment of this invention.
FIG. 2 illustrates a correspondence between the original information data and data obtained by Run Length Limited coding.

FIG. 1 shows one embodiment of this invention and is a schematic of a decoding apparatus to which this invention is applied.

While this embodiment is described as being directed to a decoding apparatus which decodes the information data subjected to the (2, 7, 1, 2, 3) Run Length Limited coding in accordance with FIG. 2, this invention may be applicable to a decoding apparatus which decodes information data codes using a correspondence table of FIG. 5.

In FIG. 1, the data subjected to Run Length Limited coding and reproduced from a recording medium such as a magnetic disc, using a magnetic head or the like, not shown, is supplied to a data detection circuit 1.

Detection circuit 1 is also supplied with a synchronism clock signal synchronous with the period of one bit of the reproduction data. Detection circuit 1 takes in the reproduction data bit by bit in accordance with the synchronism clock and checks whether or not the reproduction data contains 7 successive "0"-bits. If so, detection circuit 1 supplies a high level detection signal S to a delay circuit 2.

Delay circuit 2 delays the supplied detection signal S and outputs it. It delays the detection signal S by a 4-bit interval synchronously with a synchronism clock signal supplied thereto. The delayed signal S is supplied as a reset signal R to a decode circuit 3.

Decode circuit 3 decodes the reproduced (2, 7, 1, 2, 3) Run Length Limited code to the original information data on the basis of the correspondence table shown in FIG. 2. It is to be noted that the (2, 7, 1, 2, 3) Run Length Limited codes are ones having a variable length. Therefore, during recording, an index signal is inserted each time a predetermined quantity of data is recorded. During reproduction, the index signals are detected, the data directly subsequent to the index signal is determined to be the head of the code word, and the further subsequent data is decoded in accordance with the correspondence table shown in FIG. 2.

In FIG. 1, when an index signal in the reproduction data is detected in the index signal detection circuit, not shown, during reproduction, a reset signal is output to a terminal 4 and supplied to decode circuit 3 to start decoding. Namely, decode circuit 3 corrects the head of a code word in the reproduction data each time the index signal is detected to thereby decode the information.

After an index signal has been detected, each time coded data shown in FIG. 2 appears in the serially input data until the next index signal is detected, the coded data is converted to the corresponding information data, and the next input data is decoded as the head of the next coded data. Therefore, if synchronization between the synchronism clock and the input reproduction data becomes disordered due to the influence of jitter, etc., the head of the coded data would be shifted to thereby render correct decoding impossible thereafter until the next index signal is detected.

In order to avoid this, a detection circuit 1 as shown in FIG. 1 detects the presence of 7 successive data "0"-bits in the reproduction data. If 7 successive "0"-bits are detected, the fifth reproduced bit data input after that detection is regarded as the head of the coded data to correct the decoding.

If the reproduction data contains 7 successive "0"-bits, as shown in FIG. 2, it is related necessarily to the coded data "00001000". Namely, the last 4 bits of 7 successive data "0"-bits are the head -4th data "0"-bits of the coded data "00001000". Therefore, the head of the coded data following the coded data "00001000" is necessarily the fifth data bit from the 7 successive data "0"-bits.

Therefore, as in the case in which an index signal is detected by using a reset signal output from delay circuit 2 as shown in FIG. 1, decoding is corrected to reduce erroneous decoding due to disordered synchronism between index signals.

Now the embodiment of FIG. 1 will be described with reference to FIGS. 3 and 4.

Detection circuit 1 shown in FIG. 1 includes, for example, a shift register 11, inverters 12 and 13, and a NAND gate 14.

Figure 3:
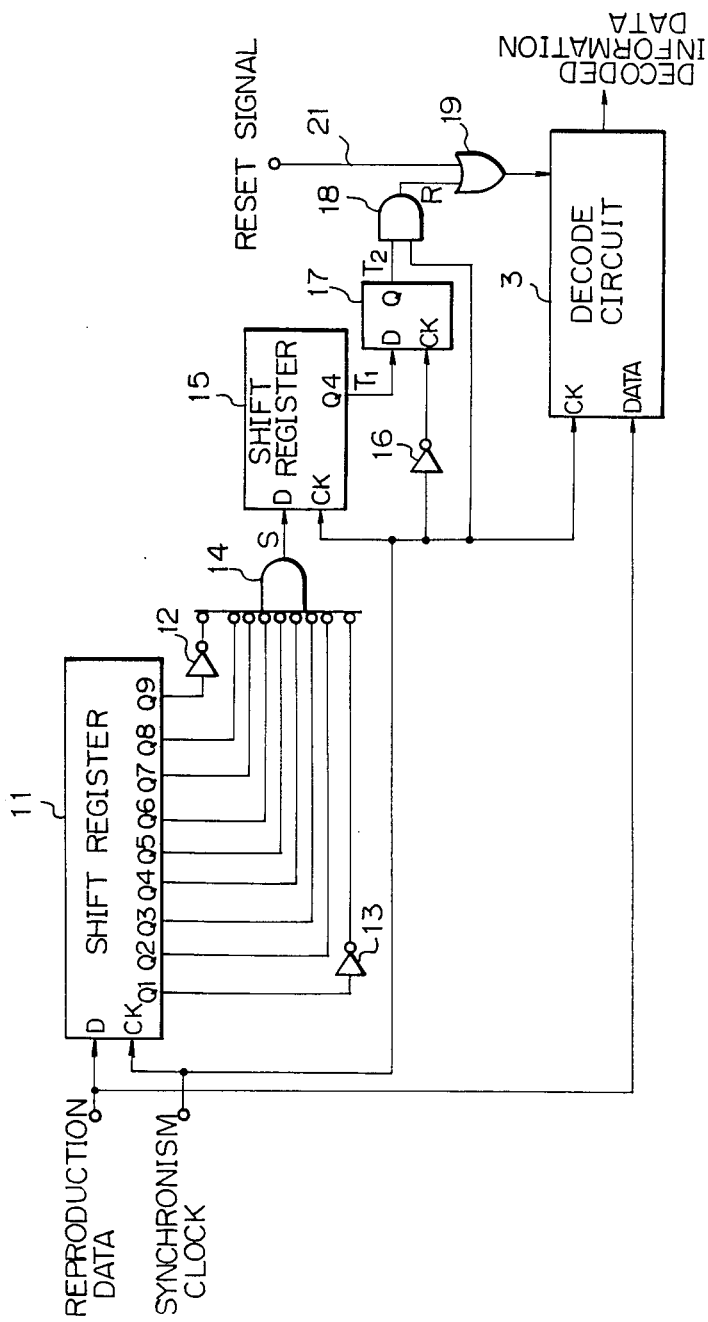
FIG. 3 shows the details of the FIG. 1 embodiment.
Figure 4:
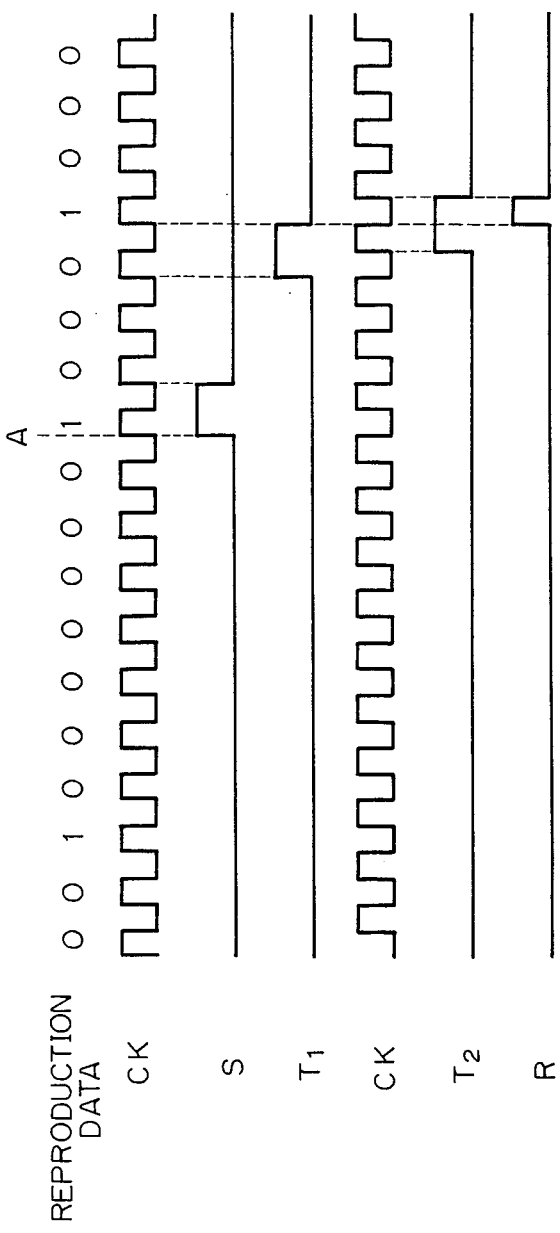
FIG. 4 is a timing chart for the FIG. 3 embodiment.

In FIG. 3, reproduction data is supplied to shift register 11 to which a synchronism clock signal CK is supplied which outputs a signal of high and low levels repeated alternately for each bit interval as shown in FIG. 4. The reproduction data supplied is taken in bit by bit synchronously with the synchronism clock signal. The taken in reproduction data is shifted in the order Q1–Q9 as shown, synchronously with the synchronism clock. Each time a new data bit is received, the respective output terminals Q1–Q9 output data. The bit data output from terminals Q1 and Q9 among the output bit data are inverted by inverters 12 and 13 and supplied to NAND gate 14 and other data as they are supplied to NAND gate 14.

As well known, NAND gate 14 outputs a high level signal when all the input data bits are "0". Namely, as shown in FIG. 4, if 7 successive data "0"-bits are input following a data "1"-bit and a data "1"-bit is then input, all the data bits supplied to NAND gate 14 will be "0", so that as shown in FIG. 4, NAND gate 14 outputs a detection signal S which rises at the rising edge (A in FIG. 4) of a synchronism clock signal CK pulse and falls at the falling edge thereof, thereby detecting that there have been 7 successive data "0"-bits. Thus the output signal from NAND gate 14 is supplied to shift register 15.

Shift register 15, inverter 16, flip-flop 17 and AND gate 18 constitute delay circuit 2 shown in FIG. 1. Shift register 15 includes a 4-bit shift register and shifts the input signal S by 4 bits in accordance with the synchronism clock signal CK to output a signal T1 shown in FIG. 4 from terminal Q4 to flip-flop 17. Flip-flop 17 is supplied with and operated in accordance with an inverse of the synchronism clock signal, $\overline{CK}$, via inverter 16, so that it outputs a signal T2 shown in FIG. 4 and supplies it to AND gate 18. Another input terminal of AND gate 18 is supplied with synchronism clock signal CK, so that AND gate 18 outputs a reset signal R shown in FIG. 4.

The reset signal, thus produced, is supplied to an OR gate 19 which is also supplied with a reset signal produced by detection of an index signal inserted in the reproduction data using an index signal detection circuit, not shown, as in FIG. 1. When an index signal appears in the reproduction data or 7 successive data "0"-bits appear in the reproduction data, OR gate 19 supplies a reset signal to decode circuit 3. Immediately after the reset signal is supplied to decode circuit 3, decode circuit 3 decodes the supplied reproduction data as the head of the coded data and outputs decoded information data, as in FIG. 1.

While in this embodiment it is checked whether or not 7 successive data "0"-bits have appeared between adjacent data "1"-bits, similar effects can be obtained by checking only whether or not 7 successive data "0"-bits have appeared, whether or not 7 successive data "0"-bits have followed a data "1"-bit or whether or not a data "1"-bit has appeared following 7 successive data "0"-bits.

If the decode circuit used herein is arranged so that its decoding is externally reset, it may be applicable to a logic circuit using a shift register, etc., or a converter circuit using a memory, etc.

If this invention is applied to a decoding apparatus which decodes the information data subjected to (2, 7, 1, 2, 3) Run Length Limited coding on the basis of a correspondence table shown in FIG. 5, a 2-bit register is used as the shift register 15 of FIG. 3 or the reproduction data is delayed using a shift register or the like. When 7 successive "0s" are detected at NAND gate 14 of FIG. 3, the fourth reproduction data bit before that detection may be regarded as the head of the coded data to recover accurate information data.

I claim:

1. An information data recovering apparatus which recovers original information data from transmitted data of (2, 7, 1, 2, 3) Run Length Limited code to which the original information data has previously been converted, comprising:
   (a) means for receiving the transmitted data and detecting the data pattern of a train of n data bits of the input transmitted data, where n is an integer of 7 or more;
   (b) determination means for outputting a determination signal when a train of data bits having a data pattern including 7 successive data "0"-bits is detected by the receiving and detecting means; and
   (c) means for converting the input transmitted data to the original information data when the determination means outputs the determination signal, such that a bit, which is at a position spaced by a predetermined number of bits from the bit being input at a time the determination signal is output, is a border bit of the original information data.

2. An information data recovering apparatus according to claim 1, wherein the converting means comprises:
   (d) a delay circuit for delaying the determination signal output from the determination means by a predetermined bit interval; and
   (e) a decode circuit for starting to decode the transmitted data in accordance with the input of the determination signal when the determination signal delayed by the delay circuit is input to the decode circuit.

3. An information data recovering apparatus according to claim 2, wherein the delay circuit is arranged to delay the determination signal output from the determination means by a 4-bit interval.

4. An information data recovering apparatus according to claim 2, wherein the delay circuit is arranged to delay the determination signal output from the determination means by a 2-bit interval.

5. An information data recovering apparatus according to claim 2, wherein the decode circuit is arranged such that it receives a reset signal different from the determination signal added to the train of transmitted data to start to decode the transmitted data in accordance with the input of the reset signal.

6. An information data recovering apparatus which recovers original information data from transmitted data of (2, 7, 1, 2, 3) Run Length Limited code to which the original information data has previously been converted, comprising:
   (a) detection means for receiving the transmitted data, detecting data consisting of 7 successive "0"-bits and outputting a detection signal when the data consisting of 7 successive "0"-bits is detected;
   (b) data conversion means for converting the transmitted data to original information data in one-to-one correspondence to a data train pattern of the transmitted data; and
   (c) control means for controlling the data conversion means so that the data conversion means converts said transmitted data such that the bit being input at a predetermined bit interval after the detection signal is output from the detection means, is a border bit of said transmitted data.

7. An information data recovering apparatus according to claim 6, wherein the data conversion means includes a memory which stores information data in one-to-one correspondence to the data train pattern of the transmitted data and that the memory is arranged such that when transmitted data is input to the memory, the memory outputs information data stored in one-to-one correspondence to the data train pattern of the transmitted data.

8. An information data recovering apparatus according to claim 6, wherein the data conversion means includes a logic circuit for outputting information data in one-to-one correspondence to the data train pattern of the transmitted data and that the logic circuit is arranged so that when transmitted data is input, the logic circuit outputs information data in one-to-one correspondence to the data train pattern of the input transmitted data.

9. An information recovering apparatus according to claim 6, wherein the control means includes a delay circuit for (1) delaying the detection signal output from the detection means by the predetermined bit interval, and (2) supplying the delayed signal to the data conversion means.

10. An information data recovering apparatus according to claim 9, wherein the delay circuit is arranged so as to delay the detection signal by a 4-bit interval.

11. An information data recovering apparatus according to claim 9, wherein the delay circuit is arranged so as to delay the detection signal by a 2-bit interval.

* * * * *